United States Patent
Pickett et al.

(10) Patent No.: US 8,310,252 B2
(45) Date of Patent: Nov. 13, 2012

(54) TESTING A NONVOLATILE CIRCUIT ELEMENT HAVING MULTIPLE INTERMEDIATE STATES

(75) Inventors: Matthew D Pickett, San Francisco, CA (US); Dmitri Borisovich Strukov, Mountain View, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 390 days.

(21) Appl. No.: 12/605,441

(22) Filed: Oct. 26, 2009

(65) Prior Publication Data

US 2011/0095774 A1 Apr. 28, 2011

(51) Int. Cl.
*G01R 31/3187* (2006.01)
*G01R 31/02* (2006.01)

(52) U.S. Cl. ........... 324/750.14; 324/750.3; 324/756.01; 365/148; 327/524

(58) Field of Classification Search .............. 324/762.01–762.06, 537–754.08, 324/750.01–762.01
See application file for complete search history.

(56) References Cited

U.S. PATENT DOCUMENTS

| 5,412,258 | A | * | 5/1995 | Ogawa et al. ................. 327/170 |
| 5,508,614 | A | | 4/1996 | Garfunkel et al. |
| 7,072,781 | B1 | | 7/2006 | Gershon et al. |

OTHER PUBLICATIONS

A New Approach to the Design, Fabrucation, and Testing of Chalcogenide-Based Multi-states Phase-Change Nonvolatile Memory, H.K.Ande et al, IEEE Aug. 10, 2008, pp. 570-573.*

* cited by examiner

*Primary Examiner* — Jermele M Hollington
*Assistant Examiner* — Emily Chan

(57) ABSTRACT

A test circuit tests a nonvolatile circuit element having multiple intermediate states. The test circuit includes a waveform generator configured to apply a waveform to the circuit element connected to the test circuit. The waveform includes stress pulses applied to the circuit element over time. A detector detects a parameter of the circuit element as the waveform is applied to the circuit element.

19 Claims, 4 Drawing Sheets

TESTING A NONVOLATILE CIRCUIT ELEMENT HAVING MULTIPLE INTERMEDIATE STATES

BACKGROUND

In the competitive world of electronics, companies are continually taken to task to ensure that the products they sell are of the utmost reliability and quality. A company must test its products to determine the quality of the product at any point in the design and manufacture process. In the field of microelectronics, for example, such testing requires more advanced techniques to ensure the viability of high-speed microelectronics circuits and devices.

Techniques for testing semiconductor switches, such as conventional bipolar transistors, may involve testing the switching characteristics of the transistor. These transistors are commonly used as binary switches having only two states, on and off. For example, a threshold voltage is applied to the base of the switch to determine whether the collector-emitter gate opens (i.e., whether the transistor switches on). If the transistor does not switch to on, then it is considered defective and is not used. Also, once the threshold voltage is removed or if the voltage applied to the base falls below the threshold voltage, the collector-emitter gate should close (i.e., the transistor should switch off). If the transistor does not switch on, or does not switch off then it is considered defective and is not used.

More recent semiconductor designs involve devices that have more than just an on state and an off state. Hewlett-Packard has developed the memristor, short for memory-resistor, which is a nano-scale semiconductor device that is nonvolatile and has more than just on and off states. The memristor has intermediate states that are achieved by applying a predetermined voltage or current to the device to change the resistance of the device. The intermediate states are various resistive states of the device. Furthermore, if the predetermined voltage or current is removed, the intermediate state is maintained, hence its non-volatility. Because of the memristors characteristics, such as the intermediate states and non-volatility, conventional testing techniques for testing the on/off state of conventional transistors do not work for testing memristors. However, if mass produced, the memristors will need to be tested for quality assurance.

BRIEF DESCRIPTION OF THE DRAWINGS

The embodiments of the invention will be described in detail in the following description with reference to the following figures.

DETAILED DESCRIPTION

For simplicity and illustrative purposes, the principles of the embodiments are described by referring mainly to examples thereof. In the following description, numerous specific details are set forth in order to provide a thorough understanding of the embodiments. It will be apparent however, to one of ordinary skill in the art, that the embodiments may be practiced without limitation to these specific details. In some instances, well known methods and structures are not described in detail so as not to unnecessarily obscure the description of the embodiments. Also, the invention is described with respect to multiple embodiments. At least some of the embodiments may be practiced in combination.

According to an embodiment, a test circuit is configured to test a nonvolatile circuit element that has multiple intermediate states. An intermediate state is a state between low and high limits. The low and high limits may be a lowest low and a highest high that can be achieved by the circuit element in terms of a predetermined parameter, such as resistance, voltage, or current. For example, on and off states of a transistor or maximum low and high resistance of an ohmic circuit element are examples of the low and high limits. A circuit element is an element that is used to create a circuit, such as an integrated circuit. The circuit element is nonvolatile in that it is configured to maintain an intermediate state even when power is removed from the circuit element. The circuit element may be a passive circuit element that consumes power and provides no gain.

In one embodiment, the circuit element is a memristor. The memristor is a circuit element that exhibits memristance. Memristance is described as follows: if charge flows in one direction through the circuit element, the resistance of the circuit element increases, and if charge flows in the opposite direction in the circuit element, the resistance decreases. If the flow of charge is stopped by turning off the applied voltage, the circuit element 'remembers' the last resistance that it had (e.g., an intermediate state), and when the flow of charge starts again the resistance of the circuit element is what it was when it was last active. The memristor may be a semiconductive, passive two-terminal circuit element, and may be a nanoscale element. A memristor is further described in the U.S. Patent Publication Number 2008/0090337 dated Apr. 17, 2008, entitled "Electrically Actuated Switch" by Stan Williams, assigned to Hewlett-Packard, which is incorporated by reference in its entirety.

Figure 1A:
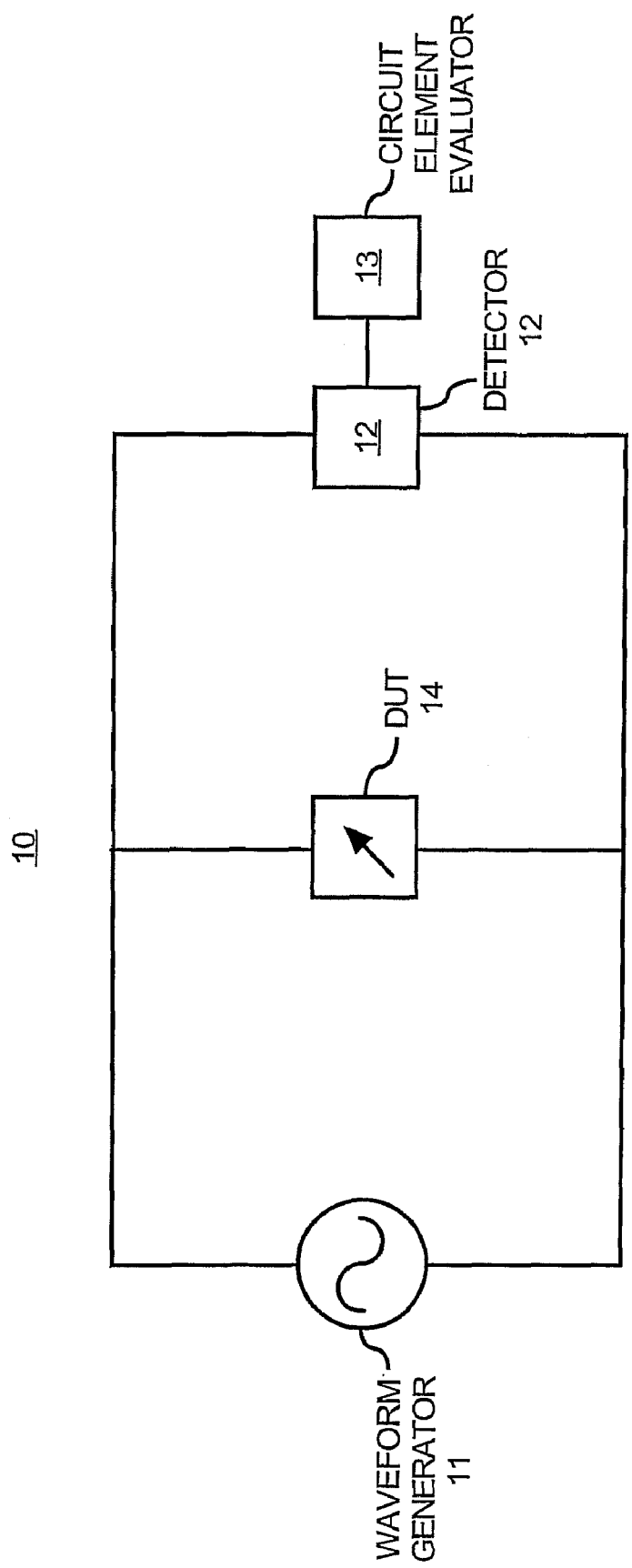
FIGS. 1A-B illustrates test circuits, according to embodiments.

The test circuit tests the various intermediate states of the circuit element instead of merely testing an on/off state of a device, such as a transistor. FIG. 1A illustrates an embodiment of a test circuit 10. The test circuit 10 includes a waveform generator 11, a device under test (DUT) 14, a detector 12, and a circuit element evaluator 13. The DUT 14 is the nonvolatile circuit element that has multiple intermediate states described above, which may be a memristor.

The waveform generator 11 generates a waveform that is applied to the DUT 14 to test whether the DUT 14 can achieve and maintain its intermediate states. The waveform represents power applied to the DUT 14. For example, the waveform includes voltage stress pulses, such as pulses of 5 volts applied to the DUT 14 over time. The detector 12 detects a parameter of the DUT 14 as the waveform is applied to the DUT 14. The detector 12 may measure the parameter as the waveform is applied to the DUT 14. The parameter may include one or more of voltage (volts), current (amps), and resistance (ohms) or impedance. The detector 14 may include a meter or other conventional test circuit component for measuring the parameter. The circuit element evaluator 13 compares the detected parameter to a predetermined set of values to determine whether the DUT 14 is operating correctly. For example, the element evaluator 13 may compare the measured resistance of a memristor as the waveform is applied to the memristor to a resistance curve representing a properly operating memristor. Based on the comparison, the element evaluator 13 determines whether the memristor is correctly achieving its intermediate states as well as its maximum and minimum resistance limits.

Figure 1B:
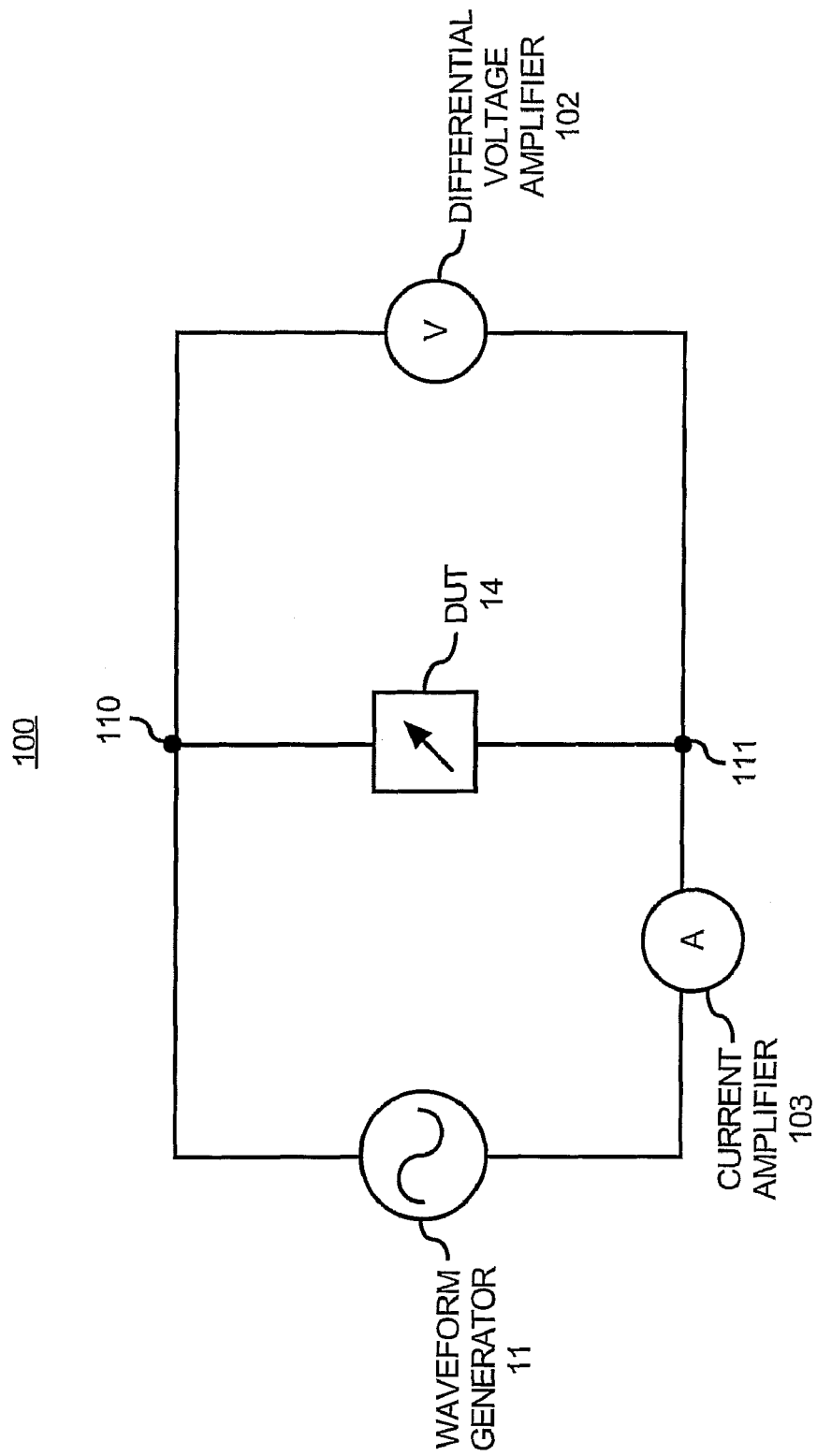

FIG. 1B illustrates a test circuit 100 configured to test a nonvolatile circuit element that has multiple intermediate states, according to an embodiment. The test circuit 100 is similar to the test circuit 10 but includes specific circuit elements for the detector 12 or circuit element evaluator 13. The test circuit 100 includes the waveform generator 11, a differential voltage amplifier 102, a current amplifier 103, and the DUT 14. The DUT 14 is the nonvolatile circuit element that has multiple intermediate states, which is being tested by the test circuit 100.

For example, the waveform generator 11 generates a voltage varying over time, for example, between 0 and 5 volts. The generated voltage is applied to the DUT 14, and a voltage difference is determined between terminals 110 and 111, which connect the DUT 14 to the test circuit 100. The differential voltage amplifier 102 is used to determine the voltage difference between terminals 110 and 111.

The current amplifier 103 may be used to determine the current flowing through the DUT 14. The resistance of the DUT 14 may then be determined as a function of the measured voltage, which is determined using the differential voltage amplifier 102, and the measured current, which is determined using the current amplifier 102. Thus, as the applied voltage generated by the waveform generator 101 varies over time, the voltage, current and/or resistance for the DUT 14 may be determined over time. A comparator, digitizer, specially programmed microcomputer, or other circuit may be used as the circuit element evaluator to determine whether the DUT 14 is functioning properly based on a comparison of the detected parameter to predetermined values.

Figure 2:
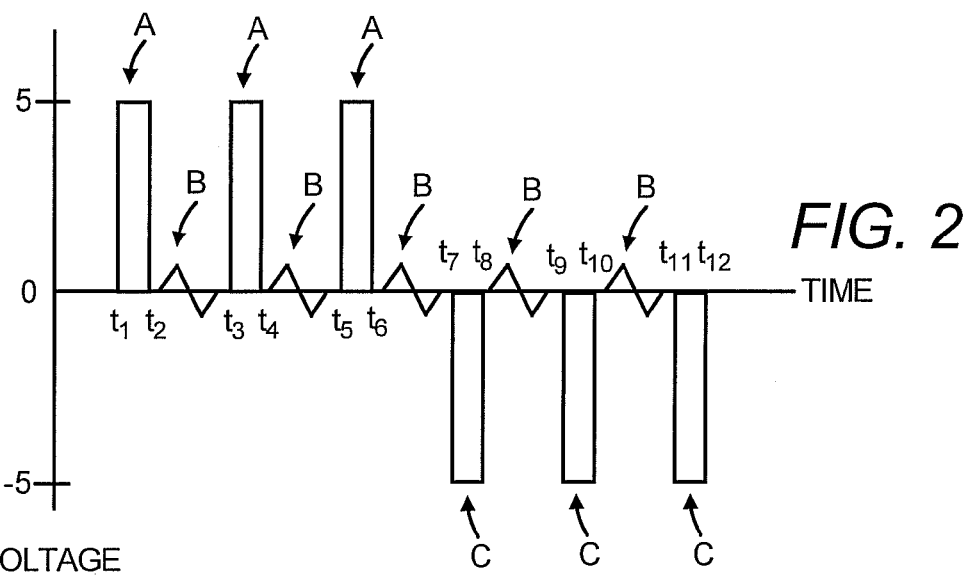
FIG. 2 illustrates an example of an input waveform for the test circuit, according to an embodiment.

FIG. 2 illustrates a waveform 200 for testing the DUT 14, according to an embodiment. The waveform 200 is generated by the waveform generator 11. As shown, the waveform 200 is comprised of stress pulses, shown as A, and test sweeps, shown as B. Stress pulses are pulses of voltage or current designed to invoke the DUT 14 to change state. The test sweeps may be sweeps of low voltage (e.g., less than 200 millivolts (mV)) or current (e.g., less than 10 microamps (uA)) designed to determine whether the DUT 14 can maintain its state if no power is applied to the DUT 14.

In this example, the stress pulses are voltage pulses. For example, the stress pulses A are 5 volt pulses maintained for a predetermined period of time, which is the width of each pulse. The stress pulses A are shown as applied between $t_1$ and $t_2$, $t_3$ and $t_4$, and $t_5$ and $t_6$. The test sweeps B are periods of time between the stress pulses A where 0.1 volts are applied to the DUT 14.

Figure 3:
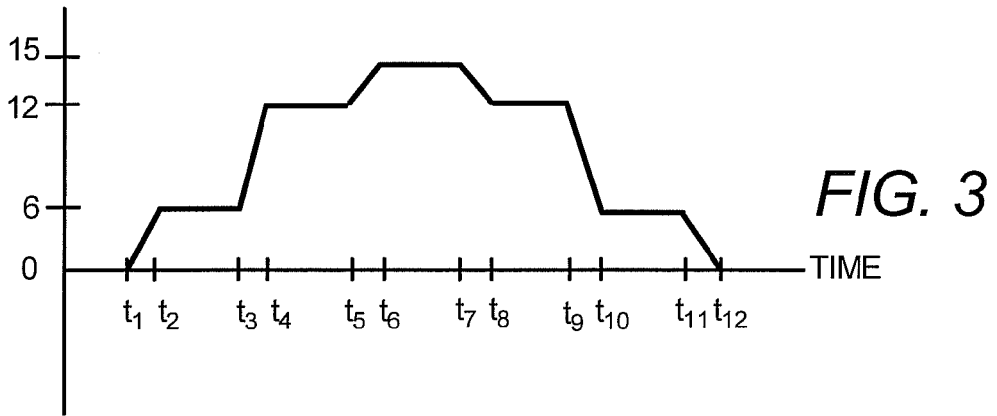
FIG. 3 illustrates an example of resistance measurements for a memristor, according to an embodiment.

FIG. 3 illustrates the resistance of the DUT 14 if it is a memristor and if the waveform 200 is applied in the test circuit 100. FIG. 3 is an example of the predetermined values of a properly functioning circuit element, and these values are compared to the detected parameter, which may be measured resistances of the DUT 14 as the waveform 200 is applied to the DUT 14. Thus, FIG. 3 may represent the measured parameter of the DUT 14 if it is properly functioning.

When the stress pulse is applied between times $t_1$ and $t_2$, the resistance of the DUT 14 increases to a first intermediate resistive state, shown by way of example as 6 ohms. When the voltage is 0.1 V during the first sweep pulse, the DUT maintains the intermediate resistive state of 6 ohms. When the stress pulse is applied between times $t_3$ and $t_4$, the resistance of the DUT 14 increases to a second intermediate resistive state, shown by way of example as 12 ohms. When the voltage is 0.1 V during the second sweep pulse, the DUT maintains the second intermediate resistive state of 12 ohms. When the stress pulse is applied between times $t_5$ and $t_6$, the resistance of the DUT 14 increases to a maximum resistance limit, shown by way of example as 15 ohms. These resistive states are achieved assuming the DUT 14 is functioning properly.

Referring back to FIG. 2, the waveform 200 may also include negative stress pulses C. Negative stress pulses are shown between times applied between $t_7$ and $t_8$, $t_9$ and $t_{10}$, and $t_{11}$ and $t_{12}$. Test sweeps are provided between the negative stress pulses C. As shown in FIG. 3, when the first negative stress pulse is applied between times $t_7$ and $t_8$, the resistance of the DUT 14 decreases to the second resistive intermediate state of 12 ohms. When the second negative stress pulse is applied between times $t_9$ and $t_{10}$, the resistance of the DUT 14 decreases to the first resistive intermediate state of 6 ohms. When the third negative stress pulse is applied between times $t_{11}$ and $t_{12}$, the resistance of the DUT 14 decreases to 0 ohms. These resistive states are achieved assuming the DUT 14 is functioning properly.

The intermediate states shown in FIG. 3 are examples of intermediate states. The number of intermediate states may vary depending on the design of the DUT 14, the length of the stress pulse, etc. Also, the resistances at the intermediate states shown in FIG. 3 are examples, and the resistances may vary depending on many factors. Also, note the polarity of the DUT 14, which may be a memristor, may be flipped to be opposite the polarity of the source, e.g., waveform generator 101. In this case, a negative stress pulse may cause the memristor to increase to a higher resistive intermediate state, and a positive stress pulse may cause the memristor to decrease to a lower resistive intermediate state. The polarity of the memristor is dependent on how it is manufactured and how it is wired in the test circuit.

Also, the waveform 200 shown in FIG. 2 illustrates an example of a waveform that may be used to test the nonvolatility as well as intermediate states of the DUT 14. Other waveforms may be provided to test other parameters of the DUT 14. For example, one stress pulse may be applied at a predetermined temperature to determine whether the DUT 14 can maintain a state at a particular temperature.

Figure 4:
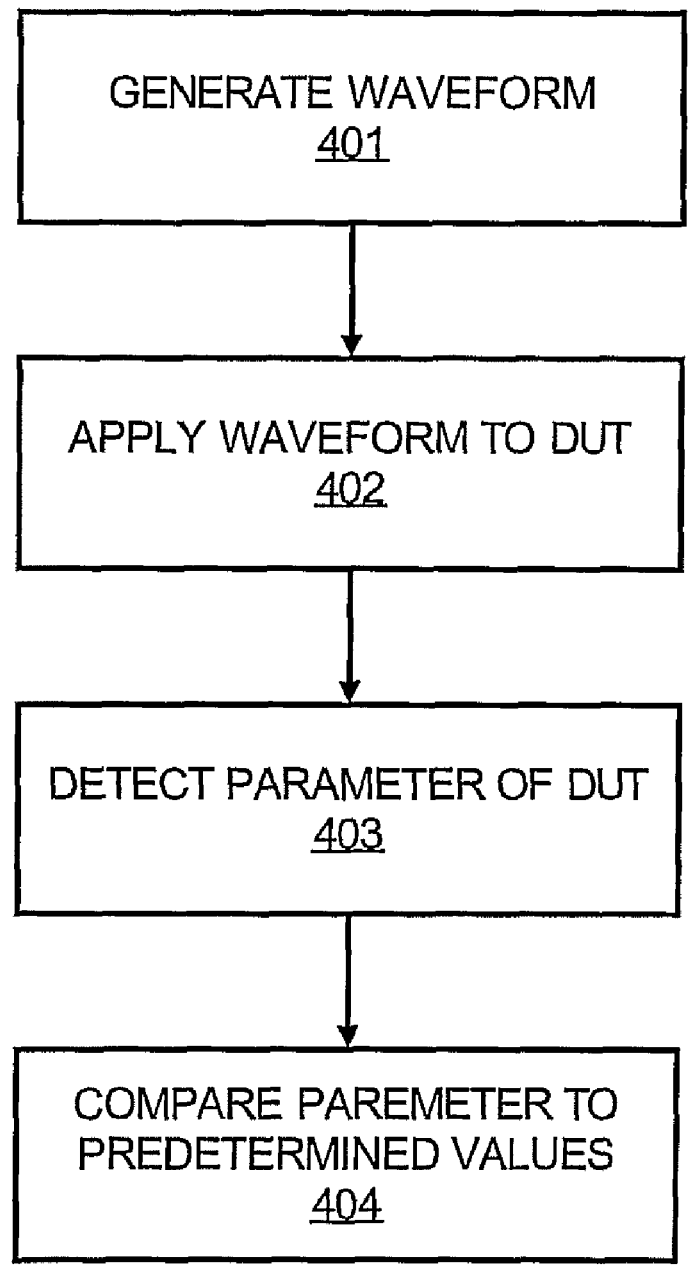
FIG. 4 illustrates a flow chart of a method for testing a device under test, according to an embodiment.

FIG. 4 illustrates a method 400 for testing a nonvolatile circuit element having multiple intermediate states, according to an embodiment. The method 400 may be performed by the test circuits described above or other test circuits. Also, one or more of the steps may be omitted or performed in different orders. At step 401, a waveform including stress pulses and test sweeps between the stress pulses is generated. For example, the waveform 200 is applied to the DUT 14. The stress pulses may include positive voltage stress pulses and negative voltage pulses with the test sweeps between the positive and negative voltage stress pulses.

At step 402, the waveform is applied to the DUT.

At step 403, a parameter of the DUT is detected as the waveform is applied to the DUT.

At step 404, the parameter is compared to predetermined values to determine whether the DUT is properly operating. Step 404 may include determining whether the DUT increases to higher resistive intermediate states in response to the positive voltage stress pulses, and determining whether the DUT decreases to lower resistive intermediate states in response to the positive voltage stress pulses. Also, step 404 may include determining whether the DUT maintains its state in response to the test sweeps. The step 404 generally may encompass determining whether the DUT achieves multiple intermediate states as the waveform is applied based on the detected parameter. The step 404 may be performed by a comparator, digitizer, specially programmed microcomputer, or other circuit. The step 404 may determine whether the DUT 14 is functioning properly based on a comparison of the detected parameter to predetermined values.

If the DUT is determined to be operating properly, it can be used in an integrated circuit for a product. Otherwise, the DUT may be discarded or reconfigured.

While the embodiments have been described with reference to examples, those skilled in the art will be able to make various modifications to the described embodiments. The terms and descriptions used herein are set forth by way of illustration only and are not meant as limitations. In particular, although the methods have been described by examples, steps of the methods may be performed in different orders than illustrated or simultaneously. Those skilled in the art will recognize that these and other variations are possible within the spirit and scope as defined in the following claims and their equivalents.

What is claimed is:

1. A test circuit configured to test a nonvolatile circuit element having multiple intermediate states, the test circuit comprising:
   a waveform generator configured to apply a waveform including stress pulses over time to a device under test (DUT) connected to the test circuit, wherein the DUT is the nonvolatile circuit element having multiple intermediate states, wherein the stress pulses are generated to determine whether the nonvolatile circuit element is able to achieve the multiple intermediate states, and the multiple intermediate states are between a maximum state and a minimum state; and
   a detector configured to detect a parameter of the DUT as the waveform is applied to the DUT.

2. The test circuit of claim 1, further comprising:
   a circuit element evaluator to evaluate the stress pulse for determining whether the DUT achieves the multiple intermediate states as the waveform is applied based on the detected parameter.

3. The test circuit of claim 1, wherein the parameter is at least one of volts, amps, and ohms.

4. The test circuit of claim 1, wherein the stress pulses comprise positive voltage stress pulses with test sweeps between the positive voltage stress pulses.

5. The test circuit of claim 4, wherein the positive voltage stress pulses test whether the DUT is operable to increase to higher intermediate states or decrease to lower intermediate states.

6. The test circuit of claim 1, wherein the stress pulses comprise negative voltage stress pulses with test sweeps between the negative voltage stress pulses.

7. The test circuit of claim 6, wherein the negative voltage stress pulses test whether the DUT is operable to increase to higher intermediate states or decrease to lower intermediate states.

8. The test circuit of claim 1, wherein the DUT is a memristor.

9. The test circuit of claim 8, wherein the memristor comprises a two-terminal, passive semiconductor device with intermediate resistive states.

10. A test circuit configured to test a memristor, the test circuit comprising:
    a waveform generator configured to apply a waveform including stress pulses and test sweeps between the stress pulses to a DUT connected to the test circuit, wherein the DUT is the memristor, and the stress pulses test whether the memristor is operable to achieve intermediate resistive states between a maximum resistive state and a minimum resistive state; and
    a detector configured to detect a parameter of the DUT as the waveform is applied to the DUT.

11. The test circuit of claim 10, wherein the test sweeps determine whether the memristor is operable to maintain the intermediate resistive states when power is not applied to the memristor.

12. The test circuit of claim 11, further comprising:
    a circuit element evaluator configured to determine whether the DUT achieves the multiple intermediate states as the waveform is applied based on the detected parameter.

13. The test circuit of claim 10, wherein the stress pulses comprise positive voltage stress pulses and negative voltage pulses with the test sweeps between the positive and negative voltage stress pulses.

14. The test circuit of claim 13, wherein the positive voltage stress pulses test whether the DUT is operable to increase to a higher resistive intermediate states or decrease to lower resistive intermediate states, and the negative voltage stress pulses test whether the DUT is operable to decrease to lower resistive intermediate states or increase to a higher resistive intermediate states.

15. The test circuit of claim 10, wherein the memristor comprises a two-terminal, passive semiconductor device with intermediate resistive states.

16. A method of testing a nonvolatile circuit element having multiple intermediate states, the method comprising:
    generating a waveform including stress pulses and test sweeps between the stress pulses;
    applying the waveform to a DUT, wherein the DUT is the nonvolatile circuit element having the multiple intermediate states, wherein the stress pulses are generated to determine whether the nonvolatile circuit element is able to achieve the multiple intermediate states, and the multiple intermediate states are between a maximum state and a minimum state; and
    detecting a parameter of the DUT as the waveform is applied to the DUT.

17. The method of claim 16, further comprising:
    evaluating the stress pulses based on the detected parameter to determine whether the DUT achieves the multiple intermediate states as the waveform is applied.

18. The method of claim 16, wherein the stress pulses comprise positive voltage stress pulses and negative voltage pulses with the test sweeps between the positive and negative voltage stress pulses, and determining whether the DUT achieves the multiple intermediate states further comprises:
    determining whether the DUT increases to higher resistive intermediate states or decreases to lower resistive intermediate states in response to the positive voltage stress pulses; and
    determining whether the DUT decreases to lower resistive intermediate states or increases to higher resistive intermediate states in response to the positive voltage stress pulses.

19. The method of claim 16, wherein the DUT is a memristor.

* * * * *